(12) United States Patent
Sung

(10) Patent No.: US 8,531,026 B2
(45) Date of Patent: Sep. 10, 2013

(54) DIAMOND PARTICLE MOLOLAYER HEAT SPREADERS AND ASSOCIATED METHODS

(75) Inventor: Chien-Min Sung, Tansui (TW)

(73) Assignee: RiteDia Corporation, Hsin Chu Industrial Park (TW)

( * ) Notice: Subject to any disclaimer, the term of this patent is extended or adjusted under 35 U.S.C. 154(b) by 0 days.

(21) Appl. No.: 13/239,189

(22) Filed: Sep. 21, 2011

(65) Prior Publication Data

US 2012/0241943 A1    Sep. 27, 2012

Related U.S. Application Data

(60) Provisional application No. 61/384,976, filed on Sep. 21, 2010, provisional application No. 61/468,917, filed on Mar. 29, 2011.

(51) Int. Cl.
*H01L 23/34* (2006.01)

(52) U.S. Cl.
USPC ............. 257/720; 257/E21.499; 257/E23.08; 438/122

(58) Field of Classification Search
USPC ............................................ 257/720, E23.08
See application file for complete search history.

(56) References Cited

U.S. PATENT DOCUMENTS

| | | |
|---|---|---|
| 3,574,580 A | 4/1971 | Stromberg et al. |
| 3,678,995 A | 7/1972 | Collard |
| 3,828,848 A | 8/1974 | Custers et al. |
| 3,829,544 A | 8/1974 | Hall |
| 3,872,496 A | 3/1975 | Potter |
| 3,912,500 A | 10/1975 | Vereschagin et al. |
| 3,913,280 A | 10/1975 | Hall |
| 3,949,263 A | 4/1976 | Harper |
| 4,224,380 A | 9/1980 | Bovenkerk et al. |
| 4,231,195 A | 11/1980 | DeVries et al. |
| 4,378,233 A | 3/1983 | Carter |
| 4,425,195 A | 1/1984 | Papanicolaou |
| 4,518,659 A | 5/1985 | Gigl et al. |
| 4,534,773 A | 8/1985 | Phaal et al. |
| 4,576,224 A | 3/1986 | Eaton et al. |
| 4,617,181 A | 10/1986 | Yazu et al. |
| 4,649,992 A | 3/1987 | Geen et al. |

(Continued)

FOREIGN PATENT DOCUMENTS

| | | |
|---|---|---|
| EP | 0391418 | 10/1990 |
| EP | 0898310 | 2/1999 |

(Continued)

OTHER PUBLICATIONS

PCT Application PCT/US2011/052626; filing date Sep. 21, 2011; Chien-Min Sung; International Search Report mailed May 2, 2012.

(Continued)

*Primary Examiner* — Zandra V. Smith
*Assistant Examiner* — Paul Patton
(74) *Attorney, Agent, or Firm* — Thorpe North & Western LLP

(57) ABSTRACT

Thermally regulated semiconductor devices having reduced thermally induced defects are provided, including associated methods. Such a device can include a heat spreader having a monolayer of diamond particles within a thin metal matrix and a semiconductor material thermally coupled to the heat spreader. In one aspect, the coefficient of thermal expansion difference between the heat spreader and the semiconductor material is less than or equal to about 50%.

6 Claims, 2 Drawing Sheets

(56) References Cited

U.S. PATENT DOCUMENTS

| | | |
|---|---|---|
| 4,664,705 A | 5/1987 | Horton et al. |
| 4,948,388 A | 8/1990 | Ringwood |
| 5,008,737 A | 4/1991 | Burnham et al. |
| 5,045,972 A | 9/1991 | Supan et al. |
| 5,070,936 A | 12/1991 | Carroll et al. |
| 5,094,985 A | 3/1992 | Kijima et al. |
| 5,096,465 A | 3/1992 | Chen |
| 5,120,495 A | 6/1992 | Supan et al. |
| 5,130,771 A | 7/1992 | Burnham et al. |
| 5,224,017 A | 6/1993 | Martin |
| 5,382,314 A | 1/1995 | Jin |
| 5,542,471 A | 8/1996 | Dickson |
| 5,614,320 A | 3/1997 | Beane et al. |
| 5,642,779 A | 7/1997 | Yamamoto et al. |
| 5,660,894 A | 8/1997 | Chen et al. |
| 5,672,548 A | 9/1997 | Culnane et al. |
| 5,696,665 A | 12/1997 | Nagy |
| 5,719,441 A | 2/1998 | Larimer |
| 5,783,316 A | 7/1998 | Colella et al. |
| 5,785,799 A | 7/1998 | Culnane et al. |
| 5,786,075 A | 7/1998 | Mishuku et al. |
| 5,812,570 A | 9/1998 | Spacth |
| 5,834,337 A | 11/1998 | Unger et al. |
| 5,895,972 A | 4/1999 | Paniccia |
| 5,982,623 A | 11/1999 | Matsuo et al. |
| 6,031,285 A | 2/2000 | Nishibayashi |
| 6,039,641 A | 3/2000 | Sung |
| 6,167,948 B1 | 1/2001 | Thomas |
| 6,171,691 B1 | 1/2001 | Nishibayashi |
| 6,193,770 B1 | 2/2001 | Sung |
| 6,215,661 B1 | 4/2001 | Messenger et al. |
| 6,238,454 B1 | 5/2001 | Polese et al. |
| 6,264,882 B1 | 7/2001 | Colella et al. |
| 6,270,848 B1 | 8/2001 | Nishibayashi |
| 6,280,496 B1 | 8/2001 | Kawai et al. |
| 6,284,315 B1 | 9/2001 | Tzeng |
| 6,335,863 B1 | 1/2002 | Yamamoto et al. |
| 6,337,513 B1 | 1/2002 | Clevenger et al. |
| 1,382,080 A1 | 2/2002 | Hall et al. |
| 6,361,857 B1 | 3/2002 | Saito et al. |
| 6,369,455 B1 | 4/2002 | Ho et al. |
| 6,390,181 B1 | 5/2002 | Hall et al. |
| 6,407,922 B1 | 6/2002 | Eckblad et al. |
| 6,413,589 B1 | 7/2002 | Li |
| 6,447,852 B1 | 9/2002 | Gordeev et al. |
| 6,448,642 B1 | 9/2002 | Bewley et al. |
| 6,482,248 B1 | 11/2002 | Holloway |
| 6,517,221 B1 | 2/2003 | Xie |
| 6,534,792 B1 | 3/2003 | Schaffer |
| 6,538,892 B2 | 3/2003 | Smalc |
| 6,541,115 B2 | 4/2003 | Pender et al. |
| 6,653,730 B2 | 11/2003 | Chrysler et al. |
| 6,706,562 B2 | 3/2004 | Mahajan et al. |
| 6,709,747 B1 | 3/2004 | Gordeev et al. |
| 6,758,263 B2 | 7/2004 | Krassowski et al. |
| 6,837,935 B2 | 1/2005 | Meguro et al. |
| 6,914,025 B2 | 7/2005 | Ekstrom et al. |
| 6,984,888 B2 | 1/2006 | Sung |
| 6,987,318 B2 | 1/2006 | Sung |
| 7,008,672 B2 | 3/2006 | Gordeev et al. |
| 7,014,093 B2 | 3/2006 | Houle et al. |
| 7,067,903 B2 | 6/2006 | Takeshi et al. |
| 7,173,334 B2 | 2/2007 | Sung |
| 7,198,553 B2 | 4/2007 | Goers |
| 7,268,011 B2 | 9/2007 | Sung |
| 7,384,821 B2 | 6/2008 | Sung |
| 7,651,386 B2 | 1/2010 | Sung |
| 7,791,188 B2 * | 9/2010 | Sung ............................ 257/706 |
| 2001/0031360 A1 | 10/2001 | Rudder et al. |
| 2002/0023733 A1 | 2/2002 | Hall et al. |
| 2003/0047814 A1 | 3/2003 | Kwon |
| 2003/0168731 A1 | 9/2003 | Matayabas et al. |
| 2004/0053039 A1 | 3/2004 | Ekstrom et al. |
| 2004/0183172 A1 | 9/2004 | Saito et al. |
| 2004/0203325 A1 | 10/2004 | Donohue |
| 2004/0238946 A1 * | 12/2004 | Tachibana et al. ............ 257/706 |
| 2005/0019114 A1 | 1/2005 | Sung |
| 2005/0025973 A1 | 2/2005 | Slutz et al. |
| 2005/0051891 A1 | 3/2005 | Yoshida et al. |
| 2005/0189647 A1 | 9/2005 | Sung |
| 2005/0231983 A1 | 10/2005 | Dahm |
| 2005/0250250 A1 | 11/2005 | Sung |
| 2005/0276979 A1 | 12/2005 | Slutz et al. |
| 2006/0073774 A1 | 4/2006 | Sung |
| 2006/0091532 A1 | 5/2006 | Sung |
| 2006/0113546 A1 | 6/2006 | Sung |
| 2006/0154392 A1 | 7/2006 | Tran et al. |
| 2006/0185836 A1 | 8/2006 | Garner |
| 2007/0128994 A1 | 6/2007 | Sung |
| 2007/0170581 A1 | 7/2007 | Sung |
| 2007/0232074 A1 | 10/2007 | Kramadhati et al. |
| 2007/0298537 A1 | 12/2007 | Sung |
| 2008/0019098 A1 | 1/2008 | Sung |
| 2008/0029883 A1 | 2/2008 | Sung |
| 2008/0271384 A1 | 11/2008 | Puthanagady et al. |
| 2008/0296756 A1 * | 12/2008 | Koch et al. .................... 257/713 |
| 2010/0101710 A1 | 4/2010 | Choi et al. |
| 2010/0102442 A1 | 4/2010 | Sung |
| 2010/0104494 A1 | 4/2010 | Meng et al. |
| 2010/0105166 A1 | 4/2010 | Francis et al. |
| 2010/0212727 A1 | 8/2010 | Lee |
| 2010/0213175 A1 | 8/2010 | Peng et al. |
| 2010/0213485 A1 | 8/2010 | McKenzie et al. |
| 2010/0213486 A1 | 8/2010 | Shi |
| 2010/0216301 A1 | 8/2010 | Chen et al. |

FOREIGN PATENT DOCUMENTS

| | | |
|---|---|---|
| EP | 991121 | 4/2000 |
| EP | 1432029 | 6/2004 |
| EP | 1452614 | 9/2004 |
| GB | 1382080 | 1/1975 |
| JP | 06015571 | 1/1994 |
| JP | 09312362 | 12/1997 |
| JP | 10223812 | 8/1998 |
| JP | 11067991 | 3/1999 |
| JP | 2000303126 | 10/2000 |
| JP | 2004146413 | 5/2004 |
| JP | 2004175626 | 6/2004 |
| WO | WO01/48816 | 7/2001 |
| WO | WO03/040420 | 5/2003 |
| WO | WO2004/034466 | 4/2004 |

OTHER PUBLICATIONS

PCT Application PCT/US2011/052627; filing date Sep. 21, 2011; Chien Min Sung; International Search Report mailed May 11, 2012.

U.S. Appl. No. 13/239,198, filed Sep. 21, 2011; Chien-Min Sung.

Horton et al; Sintered Diamond; International Industrial Diamond Association Symposium; Washington, D.C.; 1974; pp. 1-6.

Butler et al; Chemical Vapor Deposited Diamond, Maturity and Diversity; The Electrochemical Society Interface; Spring 2003; pp. 22-26.

Chen et al; Effect of Nucleation Methods on Characteristics of Low-Temperature Deposited Ultrananocrystalline Diamond; Abstract only; http://nano.anl.gov.ADC2005/pdfs/abstracts/pster2.9-8ADC0037Lin.pdf; printed May 2005; pp. 1-2.

Hall et al; Sintered Diamonds; Science; Aug. 28, 1970; pp. 1-2; vol. 169.

Huang et al; Synthesis of Large-Area, Think, Uniform, Smooth Ultrananocrystalline Diamond Films by Microwave Plasma-Assisted Chemical Vapor Deposition; Abstract only; http://nano.anl.gov/ADC2005/pdfs/abstracts/poster1/9-1_AD; Printed May 2005; pp. 1-2.

Liu et al; Studies on Nucleation Process in Diamond CVD: An Overview of Recent Development; Diamond and Related Materials; Sep. 1995; pp. 1-28; vol. 4, issue 10.

Liu et al; Nucleation Kinetics of Diamond on Carbide-Forming Substrates During CVD-I. Transient Nucleation Stage; Fourth International Symposium on Diamond Materials; Reno, NV; May 21-26, 1995; pp. 1-16.

Sun et al; Fabrication and Characterization of Diamond-Copper Composites for Thermal Management Substrate Applications; Abstract only; Materials Science and Engineering B41; 1996; p. 1.

May et al; Diamond Thin Films: A 21$^{st}$-Century Material; Phil. Trans. R. Soc. Lond.; 2000; pp. 473-495; vol. 358.

Patsil et al; Microwave Plasma Deposition of Diamond Like Carbon Coatings; Pramana-Journal of Physics; Nov. and Dec. 2000; pp. 933-939; vol. 55, Nos. 5-6.

Piazza et al; Effects of Nano- and Micor-Crystalline Seeds on the Growth of Nano- and Micro-Crystalline Diamond Thin Films; Abstract Only; http://nano.anl.gov.ADC2005.pdfs/abstracts/poster2/9-10_ADC0071_Morell.pdf; printed May 2005; pp. 1-2.

Piazza et al; Micro- and Nano-Crystalline Diamond Film Synthesis at Substrate Temperatures Sub 400° C.; Abstract only; http://nano.anl.gov/ADC2005/pdfs/abstract/session9/ADC0069_Morell.pdf; printed May 2005; pp. 1-2.

Pope et al; Sintered Diamond: Its Possible Use as a High Thermal Conductivity Semiconduction Device Substrate; Proc. 4$^{th}$ International Conference on High Pressure (AIRAPT); Kyoto, Japan; 1974; pp. 1-5.

Rebello et al; Diamond Growth by Laser-Driven Reactions in a CO/H2 Mixture; Appl. Phys. Lett.; Feb. 22, 1993 pp. 899-901; vol. 62, No. 8.

Rebello et al; Diamond Growth from a CO/CH4 Mixture By Laser Excitation of CO: Laser Excited Chemical Vapor Deposition; J. Appl. Phys.; Aug. 1992; pp. 1133-1136; vol. 72, No. 3.

Semikina et al; Liquid Carbon Sources for Deposition of Nanostructural Diamond; http://nano.anl.gov/ADC2005/pdfs/abstracts-poster1/9-13_ADC0010_Takagi.pdf; printed May 2005; pp. 1-2.

Sun et al; Fabrication and Characterization of Diamond/Copper Composites for thermal Management Substrate Application; Materials Science and Engineering B41; 1996; pp. 261-266.

U.S. Appl. No. 11/056,339, filed Feb. 10, 2005; Chien-Min Sung.

U.S. Appl. No. 11/266,015, filed Nov. 2, 2005; Chien-Min Sung.

Bonhaus et al; Optimizing the Cooling of High Power GaAsLaser Diodes by Using Diamond Heat Spreaders; Printed May 11, 2005; http://www.fernuni-hagen.de/LGBE/papers/opcool.html; p. 1-2.

U.S. Appl. No. 11/891,298, filed Aug. 2007; Chien-Min Sung.

U.S. Appl. No. 12/255,823, filed Oct. 22, 2008; Chien-Min Sung; notice of allowance dated Sep. 21, 2012.

U.S. Appl. No. 12/255,823, filed Oct. 22, 2008; Chien-Min Sung; notice of allowance dated Dec. 26, 2012.

U.S. Appl. No. 12/168,110, filed Jul. 5, 2008; Chien-Min Sung; notice of allowance dated Jan. 18, 2013.

* cited by examiner

DIAMOND PARTICLE MOLOLAYER HEAT SPREADERS AND ASSOCIATED METHODS

PRIORITY DATA

This application claims the benefit of U.S. Provisional Patent Application Ser. Nos. 61/384,976 and 61/468,917, filed on Sep. 21, 2010 and Mar. 29, 2011 respectively, each of which are incorporated herein by reference.

BACKGROUND OF THE INVENTION

Progress in the semiconductor industry has been following the trend of Moore's Law that was proposed in 1965 by then Intel's cofounder Gordon Moore. This trend requires that the capability of integrated circuits (IC) or, in general, semiconductor chips double every 18 months. Along with such advances comes various design challenges. One of the often overlooked challenges is that of heat dissipation. Most often, this phase of design is neglected or added as a last minute design before the components are produced. According to the second law of thermodynamics, the more work that is performed in a closed system, the higher entropy it will attain. With the increasing power of a central processing unit (CPU), the larger flow of electrons produces a greater amount of heat. Therefore, in order to prevent the circuitry from shorting or burning out, the heat resulting from the increase in entropy must be removed. Some state-of-the-art CPU's have a power of about 70 watts (W) or more. For example, a CPU made with 0.13 micrometer technology may exceed 100 watts. Current methods of heat dissipation, such as by using metal (e.g., Al or Cu) fin radiators, and water evaporation heat pipes, will be inadequate to sufficiently cool future generations of CPUs.

Semiconductor devices can thus generate high amounts of heat during use. Heat spreader materials are often thermally coupled to such semiconductor devices in order to spread heat throughout the surface area to allow a more rapid thermal dissipation. One material that has been used for such a purpose is copper. Such a design has a flaw, however. The coefficient of thermal expansion (CTE) for copper is three times greater than the CTE of most semiconductors. Due to this CTE mismatch, a semiconductor device such as LED that is operated at high temperatures can exhibit internal stress, and in some cases such stress can lead to thermally induced defects such as micro cracks, layer separation, and the like. Such defects are initiated at the interface between the copper and the semiconductor due to the different rates of expansion and contraction of the two materials, and can result in semiconductor failure.

SUMMARY OF THE INVENTION

The present invention provides thermally regulated semiconductor devices having reduced thermally induced defects and associated methods. In one aspect, for example, a thermally regulated semiconductor device having reduced thermally induced defects can include a heat spreader having a monolayer of diamond particles within a thin metal matrix and a semiconductor material thermally coupled to the heat spreader. In one aspect, the coefficient of thermal expansion difference between the heat spreader and the semiconductor material is less than or equal to about 50%. In another aspect, the coefficient of thermal expansion difference between the heat spreader and the semiconductor material is less than or equal to about 5.0 ppm/C°. In yet another aspect, the coefficient of thermal expansion difference between the heat spreader and the semiconductor material is less than or equal to about 3.0 ppm/C°. In a further aspect, the coefficient of thermal expansion difference between the heat spreader and the semiconductor material is less than or equal to about 1.0 ppm/C°.

The present invention additionally provides methods for reducing thermally induced defects between a heat spreader and a semiconductor device. In one aspect, such a method can include disposing a monolayer of diamond particles within a thin metal heat spreader and thermally coupling the heat spreader to a semiconductor material, where the coefficient of thermal expansion difference between the heat spreader and the semiconductor material is less than or equal to about 50%. In another aspect, the coefficient of thermal expansion difference between the heat spreader and the semiconductor material is less than or equal to about 5.0 ppm/C°. In yet another aspect, the coefficient of thermal expansion difference between the heat spreader and the semiconductor material is less than or equal to about 3.0 ppm/C°. In a further aspect, the coefficient of thermal expansion difference between the heat spreader and the semiconductor material is less than or equal to about 1.0 ppm/C°.

In another aspect, disposing the monolayer of diamond particles within the thin metal heat spreader further includes applying the monolayer of diamond particles on a first metal layer and disposing a second metal layer on the first metal layer such that the monolayer of diamond particles is sandwiched therebetween. The first and second metal layers are then pressed together with sufficient heat and pressure to fix the diamond particles within the metal layers. In one specific aspect, at least one of the first and second metal layers is less than or equal to about 200 microns thick. In another specific aspect, at least one of the first and second metal layers is less than or equal to about 100 microns thick.

In yet another aspect, disposing the monolayer of diamond particles within the thin metal heat spreader further includes disposing the monolayer of diamond particles within a metal powder and sintering the metal powder with sufficient heat and pressure to fix the diamond particles within the sintered metal. In a more specific aspect, disposing the monolayer of diamond particles within the metal powder further includes applying the monolayer of diamond particles onto a metal layer and applying the metal powder onto the metal layer and the diamond particles.

In a further aspect, disposing the monolayer of diamond particles within the thin metal heat spreader further includes applying the monolayer of diamond particles on a metal substrate, disposing the metal substrate into an ionic solution containing metal ions, and introducing an electrical current into the ionic solution such that a metal layer is electroplated onto the metal substrate to secure the diamond particles.

The heat spreaders according to aspects of the present invention can be of various configurations. While such heat spreader can be of any useable thickness, in some cases thin heat spreaders can be more easily incorporated into semiconductor devices. In one aspect, for example, the heat spreader is from about 50 microns thick to about 300 microns thick. In another aspect, the heat spreader is from about 100 microns thick to about 200 microns thick. Additionally, any material capable of being formed into a heat spreader according to aspects of the present invention is considered to be within the present scope. In one aspect, for example, the heat spreader can include a material such as aluminum, copper, gold, silver, platinum, and the like, including alloys thereof. In one specific aspect, the heat spreader includes copper. In another aspect, the heat spreader includes aluminum.

Any semiconductive material that can benefit from improved thermal regulation is considered to be within the present scope. Nonlimiting examples include silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and the like, including combinations thereof. In one aspect, the semiconductor material can include gallium nitride, aluminum nitride, or a combination thereof.

In another aspect, a thermally regulated semiconductor device having reduced thermally induced defects is provided. Such a device can include a heat spreader including a thin metal layer, a first monolayer of diamond particles disposed on one side of the thin metal layer, a second monolayer of diamond particles disposed on a side opposite the first monolayer of diamond particles, and a metal matrix bonding the first and second monolayers of diamond particles to the thin metal layer. The device further includes a semiconductor material thermally coupled to the heat spreader, wherein the coefficient of thermal expansion difference between the heat spreader and the semiconductor material is less than or equal to about 50%.

There has thus been outlined, rather broadly, various features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

Figure 1:
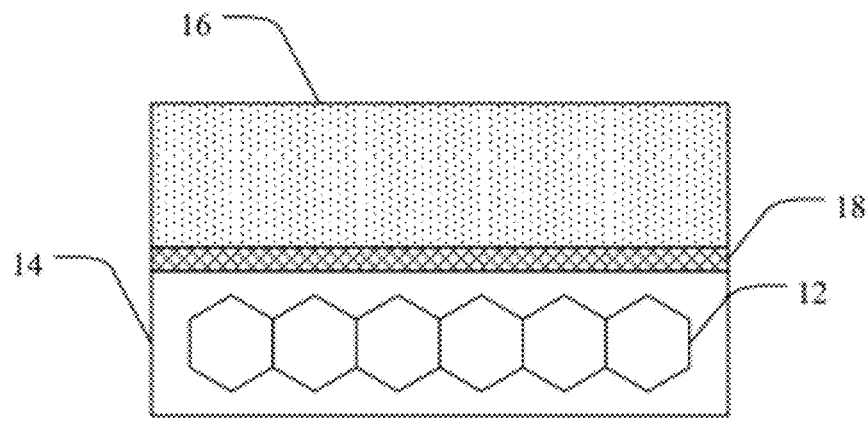
FIG. 1 is a schematic view of a heat spreader device in accordance with an embodiment of the present invention.

It will be understood that the above figures are merely for illustrative purposes in furthering an understanding of the invention. Further, the figures are not drawn to scale, thus dimensions, particle sizes, and other aspects may, and generally are, exaggerated to make illustrations thereof clearer. Therefore, departure can be made from the specific dimensions and aspects shown in the figures in order to produce the heat spreaders of the present invention.

DETAILED DESCRIPTION

Before the present invention is disclosed and described, it is to be understood that this invention is not limited to the particular structures, method steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an" and, "the" include plural referents unless the context clearly dictates otherwise. Thus, for example, reference to "a diamond particle" includes one or more of such particles and reference to "the layer" includes reference to one or more of such layers.

Definitions

In describing and claiming the present invention, the following terminology will be used in accordance with the definitions set forth below.

As used herein, "particle" is as used herein in connection with diamond particles, and refers to a particulate form of diamond. Such particles may take a variety of shapes, including round, oblong, square, euhedral, etc., can be either single crystal or polycrystalline, and can have a number of mesh sizes. As is known in the art, "mesh" refers to the number of holes per unit area as in the case of U.S. meshes. All mesh sizes referred to herein are U.S. mesh unless otherwise indicated. Further, mesh sizes are generally understood to indicate an average mesh size of a given collection of particles since each particle within a particular "mesh size" may actually vary over a small distribution of sizes.

As used herein, "heat spreader" refers to a material or composite article that distributes or conducts heat and transfers heat away from a heat source.

As used herein, "heat source" refers to a device or object having an amount of thermal energy or heat that is greater than desired. Heat sources can include devices that produce heat as a byproduct of their operation, as well as objects that become heated to a temperature that is higher than desired by a transfer of heat thereto from another heat source.

As used herein, "sintering" refers to the joining of two or more individual particles to form a continuous solid mass. The process of sintering involves the consolidation of particles to at least partially eliminate voids between particles. Sintering of diamond particles generally requires ultrahigh pressures and the presence of a carbon solvent as a diamond sintering aid.

The term "metallic" refers to both metals and metalloids. Metals include those compounds typically considered metals found within the transition metals, alkali and alkali earth metals. Examples of metals are Ag, Au, Cu, Al, and Fe. Metalloids include specifically Si, B, Ge, Sb, As, and Te. Metallic materials also include alloys or mixtures that include metallic materials. Such alloys or mixtures may further include additional additives. In the present invention, carbide formers and carbon wetting agents may be included as alloys or mixtures, but are not anticipated to be the only metallic component. Examples of such carbide formers are Sc, Y, Ti, Zr, Hf, V, Nb, Cr, Mo, Mn, Ta, W, and Tc. Examples of carbon wetting agents are Co, Ni, Mn, and Cr.

As used herein, "chemical bond" and "chemical bonding" may be used interchangeably, and refer to a molecular bond that exerts an attractive force between atoms that is sufficiently strong to create a binary solid compound at an interface between the atoms.

As used herein, "infiltrating" refers to when a material is heated to its melting point and then flows as a liquid through the interstitial voids between particles.

As used herein, "grade" refers to the quality of diamond particle. Higher grade indicates diamonds with fewer imperfections and inclusions. Synthetically-made diamonds are more likely than natural diamonds to include inclusions as a result of the manufacturing process. Diamonds with fewer imperfections and inclusions are better thermal conductors and therefore are preferably used in the present invention. Additionally, diamonds with imperfections and inclusions are more prone to damage under certain manufacturing conditions. Selecting diamonds of a higher grade indicates conscious selection of diamond particles beyond selection for such qualities as size, price, and/or shape. Higher grade diamonds represents at least one step above the lowest available grade diamond particles, and often represents more than one step above. Such increase in grade is generally indicated by an increase in price when compared to diamond particles of the same size. Examples of high or higher grade diamond particles include Diamond Innovations MBS-960, Element Six SDB1100, and Iljin Diamond ISD1700.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained.

The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually. This same principle applies to ranges reciting only one numerical value as a minimum or a maximum. Furthermore, such an interpretation should apply regardless of the breadth of the range or the characteristics being described.

The Invention

The inventors have discovered that a heat spreader having a similar coefficient of thermal expansion (CTE) to a semiconductor device or material can be coupled directly to that semiconductor without the need for a thermal interface material (TIM). Such a matching of CTE can greatly reduce the incidence of thermally induced defects such as micro cracks, layer separation, and the like, that can occur when the semiconductor material and the heat spreader expand and/or contract at different rates during heating and cooling.

Figure 3:
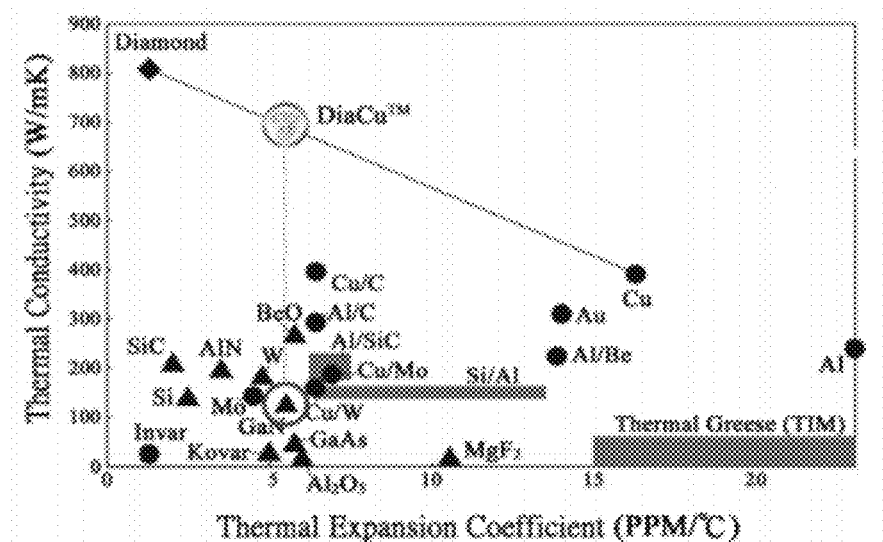
FIG. 3 is a graph of thermal coefficient of expansion versus thermal conductivity for a variety of materials.

Diamond materials generally have a thermal conductivity that is 2 to 4 times greater than copper. The CTE of diamond, however, is about ⅒ of the CTE of copper. Thus, by integrating diamond materials into a heat spreader matrix, such as copper, the thermal conductivity of the heat spreader can be increased while at the same time allowing a more uniform CTE matching with the semiconductor. In many cases, such heat spreaders can be bonded directly to the semiconductor material. FIG. 3 shows the coefficient of thermal expansion and thermal conductivity for various materials.

Disposing diamond materials such as diamond particles in a heat spreader matrix such as copper, however, can be challenging. For example, molten copper does not readily wet diamond particles. Because of this, infiltration of diamond particles by molten copper may require very high pressures, such as those generated by a cubic press. The necessity of using such a high pressure device thus limits the size of heat spreader and can greatly increase manufacturing costs.

The inventors have also discovered useful techniques for securing diamond particles in a heat spreader matrix. As such, diamond particles can be incorporated readily into a heat spreader to increase thermal conductivity and to moderate the CTE to more closely match the CTE of the semiconductor material. Such a device has a decreased interface stress between the heat spreader and the semiconductor due to temperature cycling, thus resulting in reduced thermally induced defects.

In accordance with aspects presented herein, various details are provided that are applicable to each of the heat spreaders, thermal management systems, and methods of making the same. Thus, discussion of one specific aspect is related to and provides support for this discussion in the context of the other related aspects.

Accordingly, the present invention provides devices, systems, and methods for facilitating the thermal regulation of semiconductor devices. In one aspect, as is shown in FIG. 1, a thermally regulated semiconductor device having reduced thermally induced defects is provided. Such a device can include a heat spreader including a monolayer of diamond particles 12 within a thin metal matrix 14. The device can further include a semiconductor material 16 thermally coupled to the heat spreader 10. In one aspect the coefficient of thermal expansion difference between the heat spreader and the semiconductor material is less than or equal to about 50%. In another aspect, the coefficient of thermal expansion difference between the heat spreader and the semiconductor material is less than or equal to about 5.0 ppm/C°. In yet another aspect, the coefficient of thermal expansion difference between the heat spreader and the semiconductor material is less than or equal to about 3.0 ppm/C°. In a further aspect, the coefficient of thermal expansion difference between the heat spreader and the semiconductor material is less than or equal to about 1.0 ppm/C°. In yet another aspect, the coefficient of thermal expansion difference between the heat spreader and the semiconductor material is less than or equal to about 0.5 ppm/C°. In a further aspect, the coefficient of thermal expansion difference between the heat spreader and the semiconductor material is less than or equal to about 0.25 ppm/C°. Various techniques can be utilized to couple the heat spreader to the semiconductor material. Nonlimiting examples can include techniques such as brazing, soldering, electroplating, and the like. In one aspect the heat spreader can be coupled to the semiconductor material 16 by soldering layer 18. In another aspect, the heat spreader can be coupled to the semiconductor material by an intermediate layer of a thermal interface material.

A heat spreader having a mono layer of diamond particles can provide an economical and effective mechanism for thermal management. The presence of a plurality of diamond particles arranged in such a monolayer with a single particle thickness within a heat spreader can be an economical design that is effective at thermal management when connected to a heat source. In some aspects, substantially no diamond particles are present in the metal or metallic matrix beyond the monolayer. In another aspect, the heat spreader can include multiple monolayers of diamond particles that are distinct or discrete from one another.

The heat spreader devices according to aspects of the present invention can be made in a variety of configurations and overall dimensions. Any configuration or physical dimension including a diamond monolayer in a metal or metallic matrix should be considered to be within the present scope. In some aspects, however, the present techniques can result in heat spreader devices that are thin and thus are readily incorporated into semiconductor devices and semiconductor systems. In one aspect, for example, the heat spreader is from about 50 microns thick to about 300 microns thick. In another aspect, the heat spreader is from about 100 microns thick to about 200 microns thick. In yet another aspect, the heat spreader is from about 300 microns to about 1 mm thick. It is also contemplated that heat spreaders greater than 1 mm thick are within the present scope. For example, in one aspect the heat spreader can be greater than 2 mm thick or greater than 4 mm thick.

The density of diamond particles within the monolayer can impact the efficiency of the thermal regulation of the device. Any diamond particle density is considered to be within the present scope, however greater degrees of packing tends to result in greater thermal regulation. In one aspect, for example, the diamond particle density in the monolayer is greater than or equal to about 50%. In another aspect, the diamond particle density in the monolayer is greater than or equal to about 60%. In yet another aspect, the diamond particle density in the monolayer is greater than or equal to about 70%. In a further aspect, the diamond particle density in the monolayer is greater than or equal to about 80%. In yet another aspect, substantially all of the diamond particles are in direct contact with at least one other diamond particle of the monolayer. For reference, all of the diamond particles touching each other in the monolayer would be a diamond particles density of about 100%

As has been described, diamond particles can be utilized to increase the thermal conductivity of the heat spreader while at the same time moderating or minimizing the CTE mismatch between the heat spreader and the semiconductor material. Various factors can further improve the thermal conductivity of the heat spreader, as well as, in some cases, the CTE mismatch. In one aspect, for example, higher grade diamond particles can be utilized. The thermal conductivity of low quality industrial diamond particles is not necessarily higher than metallic materials, such as copper, if the diamond particles contain inclusions and other forms of defects. Diamond particles of higher quality can transmit heat faster than lower quality diamond particles. Thus the use of higher grade diamond particles can increase the overall thermal conductivity of the heat spreader.

In another aspect, regularly-shaped diamond particles can also increase the thermal conductivity of a heat spreader, as well as improve CTE matching. Depending on the intended design of the device, it may be beneficial to incorporate diamond particles having a regular shape and/or size and to arrange such diamond particles so as to promote thermal regulation and CTE moderation. Various factors can influence the goals. In one aspect, for example, a diamond particle can be in direct physical contact with another diamond particle such contact is diamond-to-diamond rather than diamond-to-matrix-to-diamond. For example, the diamond monolayer can be made so that substantially all of the diamond particles in the monolayer are in direct contact with at least one other diamond particle in the monolayer. Thus in one aspect, substantially all diamond particles in the diamond monolayer are in diamond-to-diamond contact. In yet another aspect, substantially all diamond particles in the diamond monolayer are in direct contact with one or more diamond particles to the extent that a continuous diamond particle pathway is provided for heat flow. Additionally, it is also contemplated that in some aspects the diamond particles may be spaced apart from one another within the metal layer and that many or all of the diamond particles may not contact any other diamond particles, or may substantially contact other diamond particles.

In another aspect, the diamond particles in the diamond monolayer can be arranged to have the same or similar orientations, and such arrangement can further enhance the thermal conductivity while minimizing CTE mismatch. In addition to similar shapes, sizes, and orientations, a diamond monolayer can be constructed whereby contact between the diamond particles is maximized. For example, thermal regulation can be greater for a monolayer having faces of adjacent diamonds contacting one another as compared to a diamond monolayer having edges contacting, or even edges contacting faces. Thus maximizing the area of contact between the diamond particles can increase thermal conductivity. Maximizing the area of contact can be further facilitated by utilizing diamond particles having the same or similar sizes. Although diamond particles of any shape can be used, in one aspect the density of diamond particles in the monolayer can be increased using diamond particles that are cubic in shape.

Size can also affect the ability of diamond particles to transmit heat and to moderate the CTE mismatch. Larger diamond particles transmit heat more effectively that multiple diamond particles collectively of the same mass due to the continuous crystal lattice of the larger particle. In one aspect, diamond particles in the diamond monolayer are substantially uniform in size. Although the diamond particles can be of any size, in one aspect diamond particles can range in size from about 10 μm to about 2 mm. In another aspect diamond particles can range in size from about 35 μm to about 1 mm. In yet another aspect, diamond particles can range in size from about 50 μm to about 200 μm.

Various metal and metallic materials are contemplated as metal heat spreader materials for use in aspects of the present invention. Such materials can be utilized as metal layers, thin metal layers, metal matrixes, and the like. Any thermally conductive metal or metallic material capable of securing diamond particles therein is considered to be within the present scope. In one aspect, for example, the metallic material is a substantially pure metallic material. Metallic is understood to include metals and metalloids (e.g. Si, B, Ge, Sb, As, and Te). In another aspect, the metallic material includes multiple metal or metallic mixtures, alloys, distinct layers, and the like. Nonlimiting examples include aluminum, copper, gold, silver, platinum, and alloys and mixtures thereof. In one specific aspect, metal heat spreader includes copper. In one specific aspect, Ti can be included in a copper matrix to facilitate wetting of the diamond particles.

Although it is contemplated that the diamond particle monolayer can be centrally located in the metal heat spreader, in some aspects the monolayer can be closer to one side of the metal heat spreader layer. Such a design allows for the side of the metal layer having the diamond monolayer closer to the surface to be placed closer to the heat source. Thus, regions of the heat spreader proximate to a heat source can have a higher thermal conductivity than regions distal from the heat source.

It should be noted that the thermal properties of the interfaces between diamond particles and the metallic or metal heat spreader material can be impacted by the design of the heat spreader. For example, voids along these interfaces can act as thermal barriers. Thus a heat spreader device having diamond particles that directly contact with another within the monolayer and diamond particles that intimately contact the metal heat spreader material will exhibit a higher thermal conductivity as compared to devices without such contacts. Accordingly, diamond particles can be coated with a material to improve the thermal conductivity within the heat spreader and/or to improve the securing interface between the diamond particles and the metal heat spreader. In one aspect, the diamond particles can be coated with carbide former. Specific examples of materials that can be used to coat diamond particles include, without limitation, titanium, nickel, chromium, and the like. In addition to coating, infiltrating the diamond particle monolayer under pressure during manufacture with a metal matrix can reduce the incidence of voids within the heat spreader.

Figure 2:
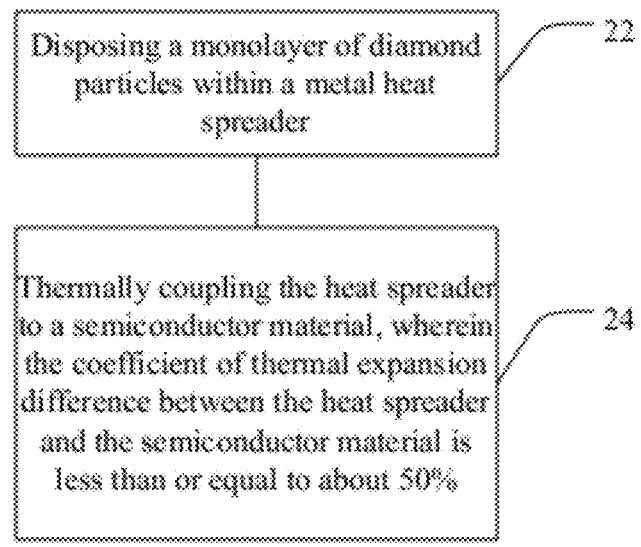
FIG. 2 is a flow chart representation of a method of reducing thermally induced defects between a heat spreader and a semiconductor device in accordance with an embodiment of the present invention.

The present invention additionally provides a method for reducing thermally induced defects between a heat spreader and a semiconductor device, as is shown in FIG. 2. Such a method can include disposing a monolayer of diamond particles within a thin metal heat spreader 22 and thermally coupling the heat spreader to a semiconductor material 24. Various methods of disposing a monolayer of diamond particles within a metal heat spreader are contemplated, and any such methods are included within the present scope. In one aspect, disposing the monolayer of diamond particles within the metal heat spreader can include applying the monolayer of diamond particles on a first metal layer, disposing a second metal layer on the first metal layer such that the monolayer of diamond particles is sandwiched therebetween, and pressing the first and second metal layers together with sufficient heat and pressure to fix the diamond particles within the metal layers. Unlike molten metal infiltration methods that require high temperatures and pressures, a heat spreader can be formed by pressing a monolayer of diamond particles between two metal layers at a relatively low temperature and pressure. Additionally, due to the thin nature of the metal layers, resulting heat spreaders can be thin. For example, in one aspect at least one of the first and second metal layers is less than or equal to about 200 µm thick. In another aspect, at least one of the first and second metal layers is less than or equal to about 100 µm thick. In yet another aspect, at least one of the first and second metal layers is from about 100 µm to about 3 mm. In a further aspect, at least one of the first and second metal layers is from about 500 µm to about 2 mm. Additionally, heat and pressures useful in making such a device can vary depending on the materials and equipment used. In one aspect, for example, the heat is from about 700° C. to about 1000° C. In another aspect, the pressure is from about 10 MPa to about 50 MPa. It should be noted that the metal layers can be of a variety of configurations. In one aspect, for example, one or more of the metal layers can be a solid metal such as a metal foil. In another aspect, one or more metal layers can be a pressed powder. For example, a metal powder can be placed in a mold and cold pressed to form a metal layer.

In another aspect of the present invention, disposing the monolayer of diamond particles within the thin metal heat spreader can be accomplished by disposing the monolayer of diamond particles within a metal powder and sintering the metal powder with sufficient heat and pressure to fix the diamond particles within the sintered metal. As with the metal aspects, metal powder sintering allows the formation of a heat spreader device having a diamond particle monolayer embedded therein to be formed at low heat and low pressure. In one aspect for example, the heat is from about 700° C. to about 1000° C. In another aspect, the pressure is from about 10 MPa to about 50 MPa. In a related aspect, disposing the monolayer of diamond particles within the metal powder can include applying the monolayer of diamond particles on a metal layer and applying the metal powder onto the metal layer and the diamond particles. The metal layer, monolayer of diamond particles, and the metal powder, can then be sintered with sufficient heat and pressure to embed the diamond particles therein. In some aspects, a metal braze material can be infiltrated into the sintered metal material.

Yet another aspect, disposing the monolayer of diamond particles within the metal heat spreader can include applying the monolayer of diamond particles on a metal substrate, disposing the metal substrate into an ionic solution containing metal ions, and introducing an electrical current into the ionic solution such that a metal layer is electroplated onto the metal substrate to secure the diamond particles. Thus by this method a solid metal heat spreader having a diamond particle monolayer embedded therein is formed. In another aspect, diamond particles can be secured to a metal substrate via brazing prior to electroplating. Any metal or metal alloy can be used for such brazing that is capable of securing the diamond particles to the metal substrate. Nonlimiting aspects can include nickel, nickel alloys and the like.

As has been described, the metal heat spreader having the embedded diamond particle monolayer can be coupled to a semiconductor layer. Numerous semiconductor materials are contemplated, and can vary depending on the intended design of the semiconductive device. Nonlimiting examples of semiconductor materials can include silicon, silicon carbide, silicon germanium, gallium arsenide, gallium nitride, germanium, zinc sulfide, gallium phosphide, gallium antimonide, gallium indium arsenide phosphide, aluminum phosphide, aluminum arsenide, aluminum gallium arsenide, gallium nitride, boron nitride, aluminum nitride, indium arsenide, indium phosphide, indium antimonide, indium nitride, and composites thereof. In one specific aspect, the semiconductor material includes a member selected from the group consisting of gallium nitride, aluminum nitride, and composites thereof.

As has been described, the heat spreader can be coupled to the semiconductor material via a variety of processes, for example by brazing, soldering, or the like. In one aspect, the heat spreader can be coupled to the semiconductor material via soldering. The presence of the diamond particle monolayer within the heat spreader moderates the CTE mismatch between the metal layer and the semiconductor such that the soldering does not cause significant thermally induced defects. In other words, because the semiconductor layer and the diamond particle impregnated heat spreader device expand and contract at similar rates, layer separation, micro cracking, and the like are avoided, or at least minimized.

The heat spreaders according to aspects of the present invention can be incorporated into a variety of devices. For example, LED devices are known to generate substantial heat for their size. At the same time, LED devices are often placed in small enclosures and confined spaces. Coupling a heat spreader as outlined herein to LED device can create adequate cooling for a very slight increase in thickness. Additionally, heat spreaders according to aspects of the present invention can be coupled to CPU devices, laser diodes, circuit boards and other circuitry laden materials, and the like.

Figure 4:
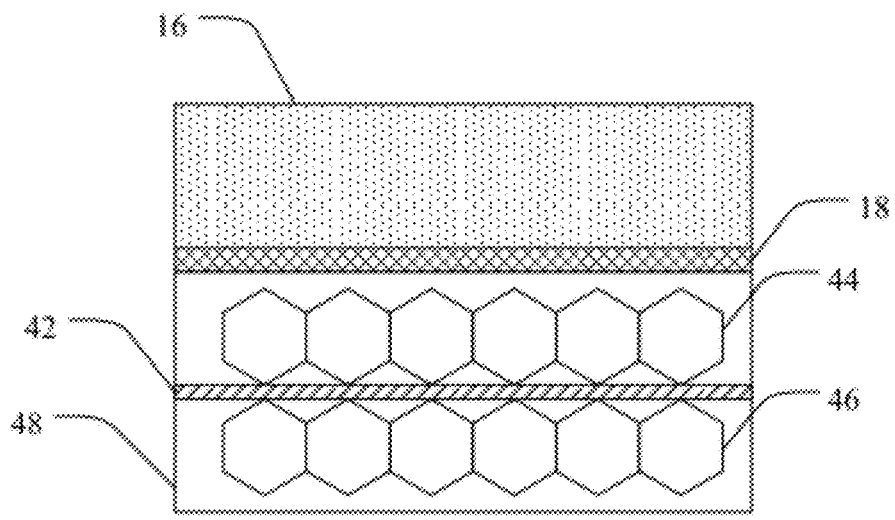
FIG. 4 is a schematic view of a heat spreader device in accordance with an embodiment of the present invention.

In another aspect of the present disclosure, a thermally regulated semiconductor device having multiple diamond particle monolayers is provided. As is shown in FIG. 4, for example, such a device can include a heat spreader having a thin metal layer 42, a first monolayer of diamond particles 44 disposed on one side of the thin metal layer 42, and a second monolayer of diamond particles 46 disposed on a side of the thin metal layer 42 opposite the first monolayer of diamond particles 44. A metal matrix material 48 bonds the first and second monolayers of diamond particles 44, 46 to the thin metal layer 42. Furthermore, as was discussed in FIG. 1, a semiconductor material 16 is thermally coupled to the heat spreader, where the coefficient of thermal expansion difference between the heat spreader and the semiconductor material is less than or equal to about 50%. The heat spreader can be thermally coupled to the semiconductor material 16 by any known technique. In one aspect, for example, the heat spreader can be soldered to the semiconductor material 16 with a soldering layer 18.

In addition to heat spreader devices, various techniques of the present invention can also be used to make tools having very closely leveled diamond tips. It should be noted that the details in the disclosure pertaining to tools can also be applicable to the heat spreader devices, and should be seen as support for such. One example of such a tool is a CMP pad dresser. Thus diamond particles can be leveled and secured within a copper or other metal material by press bonding to a flat surface at low temperature, thus eliminating many problems associated with thermal distortion in the manufacture of CMP pad dressers. In one aspect, for example, a metal layer can have a diamond particle monolayer arranged on opposing sides of the metal layer. The diamond particles can be temporarily coupled to the metal layer using an adhesive which then volatilizes away and is eliminated during heating. The metal layer can be thickened to strengthen the tool. Such thickening can also further embed the diamond particles in the metal material. As such, the diamond particles can be bonded to the metal layer by brazing, heat pressing, electroplating, or by similar techniques.

The diamond particles can be arranged in a predetermined pattern, and may further have a fixed pitch or orientation. The disposition of a single diamond layer on each side of the metal layer moderates the thermal shrinkage from the brazing temperature that would otherwise buckle a distribution of diamond on one side. By applying a diamond layer to each side of the metal or support layer, warping forces such as thermal movement and pressure can be equalized or substantially equalized on both sides. As such, the warpage of the metal or support layer can be minimized. In other words, the forces responsible for warping are applied substantially equally to each side of the metal layer and can thus cancel one another out, thus minimizing warpage that can otherwise occur. In some aspects, the single or mono diamond layers on each side of the metal layer may have matching configurations, patterns, or orientations to one another. In this way there can be a substantially matching spatial arrangement of diamond particles on each side of the metal layer. In another aspect, the configurations, patterns, or orientations can be different or varied from one another, or may be partially matching. In yet another aspect, the patterned placement of the diamond particles on one side of the metal layer may be aligned with the pattern of diamond particles on the other side of the metal layer so that particle locations match one another. In some aspects there can be a direct correspondence between the spatial positioning of diamond particles on one side of the metal layer and the spatial positioning of diamond particles on the other side of the metal layer. In another aspect, the patterns of diamond particles may match or substantially match one another, but may be offset on opposite sides of the metal layer so that particle locations do not match one another.

One benefit of minimizing the warpage of the support layer relates to the leveling of diamond particle tips in the finished tool. When heat and/or pressure are used to make a superabrasive tool, warpage of the support layer can cause great variations in tip height level, even for those particles that were leveled prior to heating and/or applying pressure. By distributing the warpage forces equally or substantially equally on both sides of the support layer through the arrangement of diamond particles, these forces effectively cancel each other with respect to the degree of warping occurring in the support layer, thus also minimizing the relative height movement of the diamond particles relative to one another. It should be noted that for the purposes of the present disclosure, "height" and terms relating to height (e.g. higher, highest, etc.) refer to a distance in a direction perpendicular to the support layer. Additionally, the term "protrusion" refers to the height or distance a particle is protruding from some reference point. In many cases, the protrusion distance can be measured from the support layer or a particular surface of the support layer. Thus the tip protrusion or the tip protrusion height would be the distance the tip of a superabrasive particle protruded from some reference point, such as, for example, a support layer surface. Similarly, a relative protrusion height difference between two particles would be the difference in the protrusion heights between these particles measured from some reference point such as the support layer. Note that since this is a relative measurement, the location of the reference point can be irrelevant, provided that this measurement is taken from a common reference point. Additionally, in some cases the superabrasive particles may lie along a slope, curvature, or some other arrangement that is not parallel to the support layer. In these cases, the protrusion height would be normalized against the slope, curvature, or other arrangement so that the relative protrusion height difference between particles can be measured in the absence of the slope, curvature, etc.

That being said, the tools according to aspects of the present invention can be made having diamond particle tips with very small relative height differences. For example, in one aspect the protrusion distance of the tip of the highest protruding diamond particle from a plurality of diamond particles in a tool is less than or equal to 20 microns from the protrusion distance of the tip of the next highest protruding diamond particle. In another aspect, the protrusion distance of the tip of the highest protruding diamond particle from a plurality of diamond particles in a tool is less than or equal to 10 microns from the protrusion distance of the tip of the next highest protruding diamond particle. In yet another aspect, the protrusion distances for the highest 10% of the protruding tips of the diamond particles of a plurality of diamond particles are within 20 microns. In yet a further aspect, the protrusion distances for the highest 10% of the protruding tips of the diamond particles of a plurality of diamond particles are within 10 microns.

Furthermore, a rigid support can be coupled to the device to facilitate handling and use. In one aspect, for example, such a rigid support can be coupled to the diamond particles on one side of the metal layer, thus leaving the diamond particles on the other side of the metal layer exposed for use in dressing a CMP pad. The rigid support can be made from any material compatible with the abrading or dressing process. Such materials can include polymeric materials, metals, ceramics, and the like. In one aspect, the rigid support can be a polymeric material and the diamond particles can be embedded therein using heat, pressure, adhesives, etc. In some aspects, the rigid support can be a non-polymeric material such as a metal layer. In such cases, the diamond particles can be bonded to the rigid support by adhesive attachment, soldering, brazing, electroplating, and the like. For brazing techniques, care should be taken not to introduce warpage into metal layer during the heating and cooling process.

In one aspect, the diamond particles can be bonded to the metal layer by brazing with a nickel-based alloy containing chromium. In another aspect, the brazing can include pressing the diamond crystals with a flat ceramic material that cannot be bonded to the braze. Various braze alloys are contemplated, including nonlimiting examples such as BNi2, BNi7, and the like. Additionally, various diamond particles sizes can be used, including mesh sizes such as 10/20, 30/40, 80/90, 90/100, 100/120, 120/140, 140/170, 170/200, 200/230, 230/270, 270/325, and 325/400.

The following examples present various methods for making the heat spreaders of the present invention. Such examples are illustrative only, and no limitation on the present invention is meant thereby.

EXAMPLES

Example 1

Ti coated diamond particles are arranged as a monolayer on a first copper metal layer. A second copper metal layer is placed on top of the diamond monolayer opposite to the first copper metal layer. This copper sandwich is hot pressed to make a copper heat spreader having a diamond particle monolayer at the center. Hydrogenated DLC is coated on one surface of the heat spreader as an insulating layer. It is sputter coated with Cr and Cu. The copper can be thickened by electroplating (e.g. to 35 microns). The copper layer can be etched to form circuits by lithography. An LED wafer with sapphire on one side and two electrodes on the other side is coupled to the etched circuits such that the two electrodes are separately bonded to two circuits.

Example 2

An LED wafer with GaN on sapphire is metalized with gold. The copper heat spreader of Example 1 is soldered onto the metalized GaN. The sapphire is split off by laser irradiation, and the GaN material is coated with indium tin oxide (ITO) as a transparent electrode, with a small area where gold is coated as the anode. The copper heat spreader acts as the cathode. Such a vertical stack LED has opposing electrodes on opposing sides of the device, and can thus allow more efficient light emission due to reduced foot print and improved cooling.

Example 3

A thin metal layer (e.g. Cu 100 microns thick) has an adhesive (e.g. 3M manufacture, 25 microns, fugitive, i.e. can vaporize to leave no residue carbon behind) on each side. Ti coated diamond particles (e.g. about 50 microns) are spread on both sides create a diamond particle monolayer on each side. Excess diamond particles are removed. The layer is placed in a graphite mold that is covered with a thin layer of Cu powder. An additional layer of Cu powder is applied on top of the layer. The assembly is then hot pressed (e.g. 900 C for 20 minutes) under vacuum or in an inert atmosphere to form a flat disk with copper layers on both sides. Due to the presence of Ti coating, Cu can bond the diamond particles firmly. The flatness of the disk is maintained by the flat mold surface. The disk is then polished on both sides to make surfaces smooth. The resulting disk contains two layers of diamond in a copper matrix with high thermal conductivity and low CTE.

Example 4

Same as with Example 3, with the exception that the thin metal Cu layer has a braze alloy layer (e.g. Cu—Sn—Ti or Ag—Cu—Ti) coupled to each side. Uncoated diamond particles are then arranged on the exposed sides of the braze alloy layers with the adhesive. The assembly is then heated to melt the braze in a vacuum furnace, resulting in a copper layer covered with diamond crystals on both sides. The diamond-attached layer is suspended in an electrolyte of $CuSO_4$ solution with connection to a cathode. The anode is a copper electrode. After passing current through the electrolyte, Cu will be plated on the copper layer and in the gaps between the diamond particles. The resulting structure is a copper heat spreader having two diamond monolayers disposed therein.

Example 5

Same as Example 4, with the exception that that the copper layer is replaced with a thin Ni layer, and the braze layers are Ni—Cr—B—Si (BNi2, e.g. Nichrobraze LM made by Wall Colmonoy), and the diamond particles (e.g. 150 microns) are arranged in a grid pattern (e.g. pitch of 500 microns intervals). The brazed double layer, instead of filling up the gaps between the particles, is pressed against a flat substrate (108 mm in diameter by 6.5 mm in thickness) with a thermal plastic adhesive in between (e.g. 150 C for 10 minutes). The result is a tool such as a CMP pad conditioner having a flat surface. A layer on each side moderates the thermal shrinkage from the brazing temperature (e.g. 1020 C for 10 minutes) that would buckle an asymmetrical distribution of diamond on one side.

Example 6

Oxygen free copper powder 1-4 microns in size is cold pressed in a mold to form a thin layer. 120/140 mesh diamond particles having a Ti coating are spread across the top of the copper in a mono layer. A second cold pressed thin copper layer is placed atop. The sandwich is hot pressed at 20 MPa and 950° C. for 20 minutes. The resultant sandwich heat spreader is polished on both sides to achieve a flatness of 10 microns and smoothness of 1 micron.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A thermally regulated semiconductor device having reduced thermally induced defects, comprising: a heat spreader including a plurality of monolayers of diamond particles within a thin metal matrix; wherein the heat spreader includes multiple distinct diamond monolayers that are not in direct contact with one another and a semiconductor material thermally coupled to the heat spreader, wherein the coefficient of thermal expansion difference between the heat spreader and the semiconductor material is less than or equal to about 50%.

2. The device of claim 1, wherein the coefficient of thermal expansion difference between the heat spreader and the semiconductor material is less than or equal to about 5.0 ppm/C°.

3. A thermally regulated semiconductor device having reduced thermally induced defects, comprising:
a heat spreader including:
a thin metal layer;
a first monolayer of diamond particles disposed on one side of the thin metal layer;
a second monolayer of diamond particles disposed on a side of the thin metal layer opposite the first monolayer of diamond particles;
a metal matrix bonding the first and second monolayers of diamond particles to the thin metal layer; and
a semiconductor material thermally coupled to the heat spreader, wherein the coefficient of thermal expansion difference between the heat spreader and the semiconductor material is less than or equal to about 50%.

4. The device of claim 3, wherein the metal matrix is a member selected from the group consisting of a braze material, a sintered material, an electroplated material, and combinations thereof 5. The device of claim 3, wherein the coefficient of thermal expansion difference between the heat spreader and the semiconductor material is less than or equal to about 5.0 ppm/C°.

6. The device of claim 3, wherein substantially all of the diamond particles in the same monolayer are in direct contact with at least one other diamond particle of that monolayer.

* * * * *